(12) United States Patent
Oda

(10) Patent No.: US 7,312,406 B2
(45) Date of Patent: Dec. 25, 2007

(54) SENSOR HAVING METALLIC HOUSING AND RESIN CONNECTOR, AND METHOD OF MANUFACTURING THE SAME

(75) Inventor: Teruo Oda, Gamagori (JP)

(73) Assignee: DENSO CORPORATION, Kariya (JP)

( * ) Notice: Subject to any disclaimer, the term of this patent is extended or adjusted under 35 U.S.C. 154(b) by 774 days.

(21) Appl. No.: 10/645,637

(22) Filed: Aug. 22, 2003

(65) Prior Publication Data
US 2004/0069627 A1    Apr. 15, 2004

(30) Foreign Application Priority Data
Sep. 9, 2002    (JP)    ............................... 2002-262966

(51) Int. Cl.
*H01L 23/28* (2006.01)
(52) U.S. Cl. ........................... 174/521; 73/753; 73/756
(58) Field of Classification Search ................ 374/185; 174/520, 521; 73/753, 756
See application file for complete search history.

(56) References Cited

U.S. PATENT DOCUMENTS

| | | | |
|---|---|---|---|
| 5,424,249 A * | 6/1995 | Ishibashi | ..................... 438/51 |
| 5,749,656 A * | 5/1998 | Boehm et al. | ............... 374/185 |
| 2001/0030596 A1* | 10/2001 | Barbier | ........................ 338/42 |
| 2005/0231067 A1* | 10/2005 | Cook et al. | ............. 310/313 R |

FOREIGN PATENT DOCUMENTS

| | | |
|---|---|---|
| JP | A-S60-120340 | 8/1985 |
| JP | U-H06-065840 | 9/1994 |
| JP | A-H07-151561 | 6/1995 |
| JP | A-10-0332495 | 12/1998 |
| JP | A-2000-105162 | 4/2000 |
| JP | A-2000-171666 | 6/2000 |
| JP | A-2002-013987 | 1/2002 |

OTHER PUBLICATIONS

Machine translation for JP 10-332495 (shirai Katsumi) Mar. 31, 2007.*
Machine translation for JP 06-65840, Mar. 31, 2007.*
Decision for Refusal from Japanese Patent Office issued on Jan. 16, 2007 for the corresponding Japanese patent application No. 2002-262966 (a copy and English translation thereof).
Notice of Reason for Rfusal from Japnese Patent Office issued on Oct. 3, 2006 for corresponding Japanese patent application No. 2002-262966 (a copy and English translation thereof).

* cited by examiner

*Primary Examiner*—Hung V. Ngo
(74) *Attorney, Agent, or Firm*—Posz Law Group, PLC

(57) ABSTRACT

A sensor includes a metallic housing having a hollow portion, a metallic terminal pin, a part of which is inserted into the hollow portion of the housing, a sensing element connected to the terminal pin, and a resin casing. The terminal pin and the resin casing provide a connector for connecting an outer circuit outside the sensor. A part of the resin casing is disposed in the hollow portion. The terminal pin and the housing are molded with the resin casing by insert molding so that the resin casing, the terminal pin, and the housing are integrated together.

18 Claims, 6 Drawing Sheets

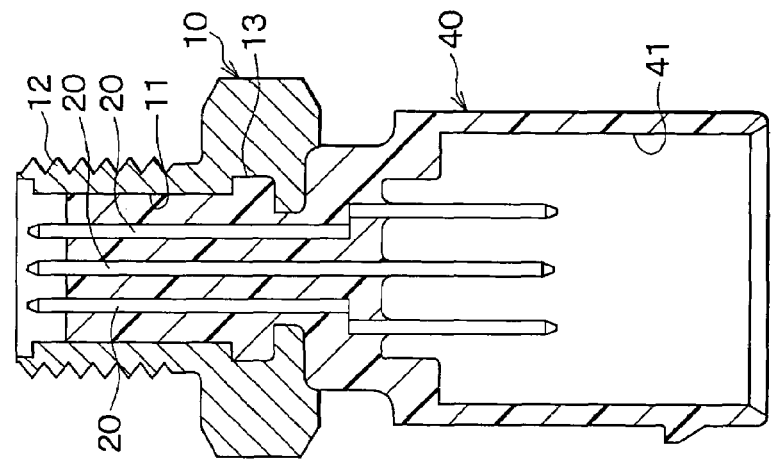
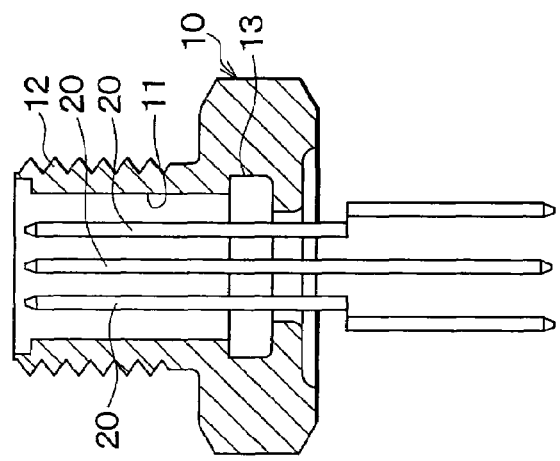
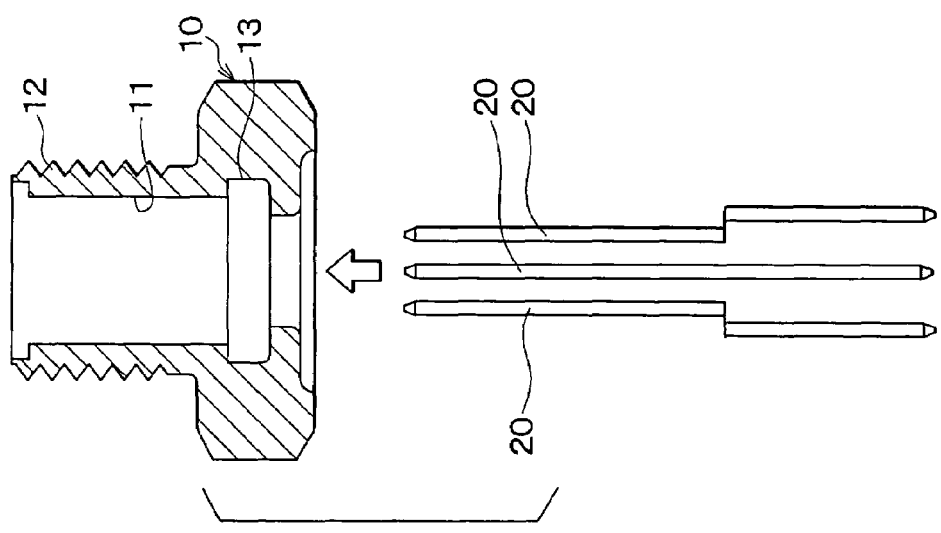

SENSOR HAVING METALLIC HOUSING AND RESIN CONNECTOR, AND METHOD OF MANUFACTURING THE SAME

CROSS REFERENCE TO RELATED APPLICATION

This application is based on Japanese Patent Application No. 2002-262966 filed on Sep. 9, 2002, the disclosure of which is incorporated herein by reference.

FIELD OF THE INVENTION

The present invention relates to a sensor having a metallic housing and a resin connector, and a method of manufacturing the same. Specifically the resin connector includes a terminal pin, and the housing and the resin connector are integrated together.

BACKGROUND OF THE INVENTION

A sensor having a metallic housing and a resin connector according to a related art includes a metallic terminal pin. The terminal pin is inserted into the casing. Then, a periphery end of the housing is crimped with the casing, so that the housing and the casing are integrated together.

However, in this sensor, the metallic housing is mounted to the resin casing by crimp joint. Therefore, it is required to increase a crimp force for increasing a joint strength between the housing and the casing. At that time, thickness of a crimp joint portion of the metallic housing and/or the resin casing is necessitated to become thicker for increasing the crimp force. Moreover, resin material composing the resin casing may be changed to another material, which has a large mechanical strength for increasing the crimp force. Thus, the sensor becomes large in size, and degree of freedom in design and specification of the sensor becomes lower.

Further, to increase the crimp force, it is required that a crimp machine for crimping the metallic housing becomes larger, and a manufacturing cost of the sensor also becomes larger. Furthermore, when the crimp force is large, it is difficult to control the crimp force finely, so that the crimp force may not fall in a range of a predetermined crimp force. Moreover, the resin material composing the casing may be damaged by a creep failure and/or a stress relaxation effect.

The above problem arises in all types of sensors, in which a housing and a connector with a terminal pin are crimped together. Especially, when a crimp force between the housing and the connector in these sensors is increased, the above problem arises remarkably.

SUMMARY OF THE INVENTION

In view of the above problem, it is an object of the present invention to provide a sensor having a metallic housing and a connector with a terminal pin, which has a large bonding strength between the housing and the connector without a crimp joint.

Moreover, it is another object of the present invention to provide a method of manufacturing a sensor having a metallic housing and a connector with a terminal pin.

A sensor includes a metallic housing having a hollow portion, a metallic terminal pin, a part of which is inserted into the hollow portion of the housing, a sensing element connected to the terminal pin, and a resin casing. The terminal pin and the resin casing provide a connector for connecting an outer circuit outside the sensor. Apart of the resin casing is disposed in the hollow portion. The terminal pin and the housing are molded with the resin casing by insert molding so that the resin casing, the terminal pin, and the housing are integrated together.

In the above sensor, since the housing, the terminal pin, and the resin casing are integrated each other, no crimp joint for fixing the housing to the casing is necessitated. Moreover, by the insert molding method, a bonding area between the resin casing and the metallic housing becomes larger. Therefore, the bonding strength between the resin casing and the housing becomes larger.

Thus, the sensor having the metallic housing and the resin casing with the terminal pin, i.e., the connector, has a large bonding strength between the housing and the connector without a crimp joint.

Preferably, the hollow portion of the housing includes an inner wall having an uneven portion for increasing bonding strength between the resin casing and the housing. More preferably, the terminal pin includes a hook portion for hooking the terminal pin to the resin casing so that the terminal pin is prevented from being removed from the resin casing. Here, the hook portion is molded with the resin casing.

When the hollow portion of the housing has a cylindrical shape with a center axis, it is preferred that the uneven portion of the hollow portion is asymmetric in relation to the center axis of the hollow portion.

In the above sensor, the resin casing is prevented from rotating by asymmetric construction of the uneven portion.

Preferably, the uneven portion has a screw shape or a wrinkle shape, or the uneven portion is a groove disposed on an inner wall of the hollow portion or a through hole penetrating the inner wall of the hollow portion. More preferably, when the uneven portion is a groove, the groove has a resin introduction port for introducing resin material in a case where the terminal pin and the housing are molded with the resin casing by insert molding.

Preferably, the hook portion of the terminal pin is a hole penetrating the terminal pin, is provided by the terminal pin having a non-linear shape, which deviates from a center axis of the terminal pin, is provided by the terminal pin having a taper shape, which expands toward one end of the terminal pin, or is provided by the terminal pin having a rough surface.

Further, a sensor includes a metallic housing having a hollow portion, a metallic terminal pin for connecting an outer circuit outside the sensor, a sensing element connected to the terminal pin, for sensing physical quantity, and a resin casing. The terminal pin is accommodated in the resin casing except for a portion, which connects to the outer circuit. The resin casing is inserted in the hollow portion of the housing so that the housing and the resin casing are integrated each other.

In the above sensor, since the housing, the terminal pin, and the resin casing are integrated each other, no crimp joint for fixing the housing to the casing is necessitated. Moreover, since a bonding area between the resin casing and the metallic housing becomes larger, so that the bonding strength between the resin casing and the housing becomes larger. Thus, the sensor having the metallic housing and the resin casing with the terminal pin, i.e., the connector, has a large bonding strength between the housing and the connector without a crimp joint.

Furthermore, a method of manufacturing a sensor includes the following steps. Here, the sensor includes a metallic housing having a hollow portion, a metallic terminal pin for connecting an outer circuit outside the sensor, a sensing element connected to the terminal pin for sensing physical quantity, and a resin casing.

The method includes the steps of inserting the terminal pin into the hollow portion of the housing, setting the housing with the terminal pin in a die after the step of inserting the terminal pin into the hollow portion, and casting resin material into the die so that the resin casing is formed such that the housing and the terminal pin are molded with the resin casing.

By the above method, the sensor having the metallic housing and the resin casing with the terminal pin, i.e., the connector, has a large bonding strength between the housing and the connector without a crimp joint.

Preferably, in the step of casting, the terminal pin is accommodated in the resin casing except for a portion, which connects to the outer circuit.

Preferably, the method further includes the step of forming an uneven portion on an inner wall of the hollow portion so as to increase bonding strength between the resin casing and the housing. More preferably, when the hollow portion of the housing has a cylindrical shape with a center axis, the uneven portion of the hollow portion is asymmetric in relation to the center axis of the hollow portion. More preferably, the uneven portion has a screw shape or a wrinkle shape, or the uneven portion is a groove disposed on the inner wall of the hollow portion or a through hole penetrating the inner wall of the hollow portion. More preferably, when the uneven portion is a groove, the method further includes the step of forming a resin introduction port in the housing. Here, the resin introduction port is reached to the groove so that the resin material is introduced into the groove through the resin introduction port in the step of casting.

Preferably, the method further includes the step of forming a hook portion in a predetermined part of the terminal pin so as to hook the terminal pin to the resin casing. Here, the hook portion is molded with the resin casing in the step of casting. More preferably, the hook portion of the terminal pin is a hole penetrating the terminal pin. More preferably, the method further includes the step of forming the terminal pin into a non-linear shape, which deviates from a center axis of the terminal pin, so that the non-linear shape provides the hook portion of the terminal pin. More preferably, the method further includes the step of forming a part of the terminal pin into a taper shape, which expands toward one end of the terminal pin, so that the taper shape provides the hook portion of the terminal pin. More preferably, the method further includes the step of roughing a surface of the terminal pin, so that the surface provides the hook portion of the terminal pin.

BRIEF DESCRIPTION OF THE DRAWINGS

The above and other objects, features and advantages of the present invention will become more apparent from the following detailed description made with reference to the accompanying drawings. In the drawings:

FIGS. 3A-3C are cross-sectional views of the sensor explaining a manufacturing method of the sensor according to the preferred embodiment.

DETAILED DESCRIPTION OF THE PREFERRED EMBODIMENT

Figure 8:
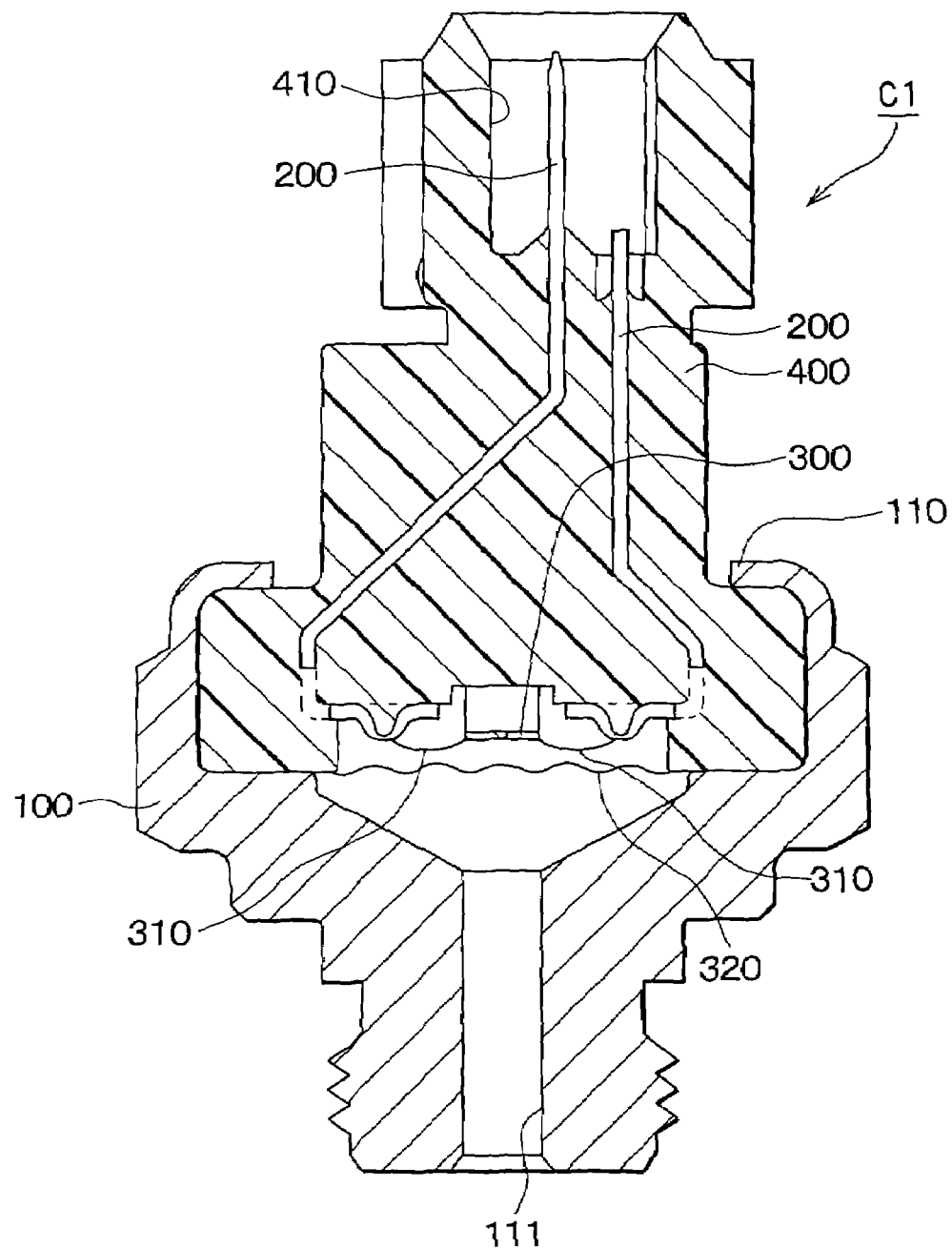
FIG. 8 is a schematic cross-sectional view showing a sensor as a comparison of the present invention.

At first, a sensor having a metallic housing and a resin connector is prepared as a comparison of the present invention by inventors. The sensor C1 is shown in FIG. 8, and includes a metallic housing 100 and a resin casing 400. A metallic terminal pin 200 is inserted into the casing 400. Then, a periphery end 110 of the housing 100 is crimped with the casing 400, so that the housing 100 and the casing 400 are integrated together. In a space between the housing 100 and the casing 400, a sensing element 300 is disposed.

The sensing element 300 is electrically connected to one end of the terminal pin 200 by a bonding wire 310. The other end of the terminal pin 200 is protruded from an opening portion 410 of the casing 400 so that the other end of the terminal pin 200 is connectable to an outer circuit outside the sensor. Thus, the opening portion 410 of the casing 400 and the terminal pin 200 provide a connector.

Measurement object such as water, oil, and air is introduced into the space between the housing 100 and the casing 400 through a measurement port 111, so that the sensing element 300 is applied with pressure of the measurement object through a metallic diaphragm 320. The sensing element 300 outputs a pressure signal in accordance with the applied pressure. The pressure signal is outputted to the outer circuit through the terminal pin 200 so that the pressure is sensed.

However, in this sensor C1, the metallic housing 100 is mounted to the resin casing 400 by crimp joint. Therefore, thickness of a crimp joint portion of the metallic housing 100 and the resin casing 400 becomes thicker for increasing the crimp force. In a case where the crimp force increases much larger, resin material composing the resin casing 400 is changed to another material, which has a large mechanical strength. Thus, the sensor C1 becomes large in size, and degree of freedom in design and specification of the sensor C1 becomes lower.

Figure 1:
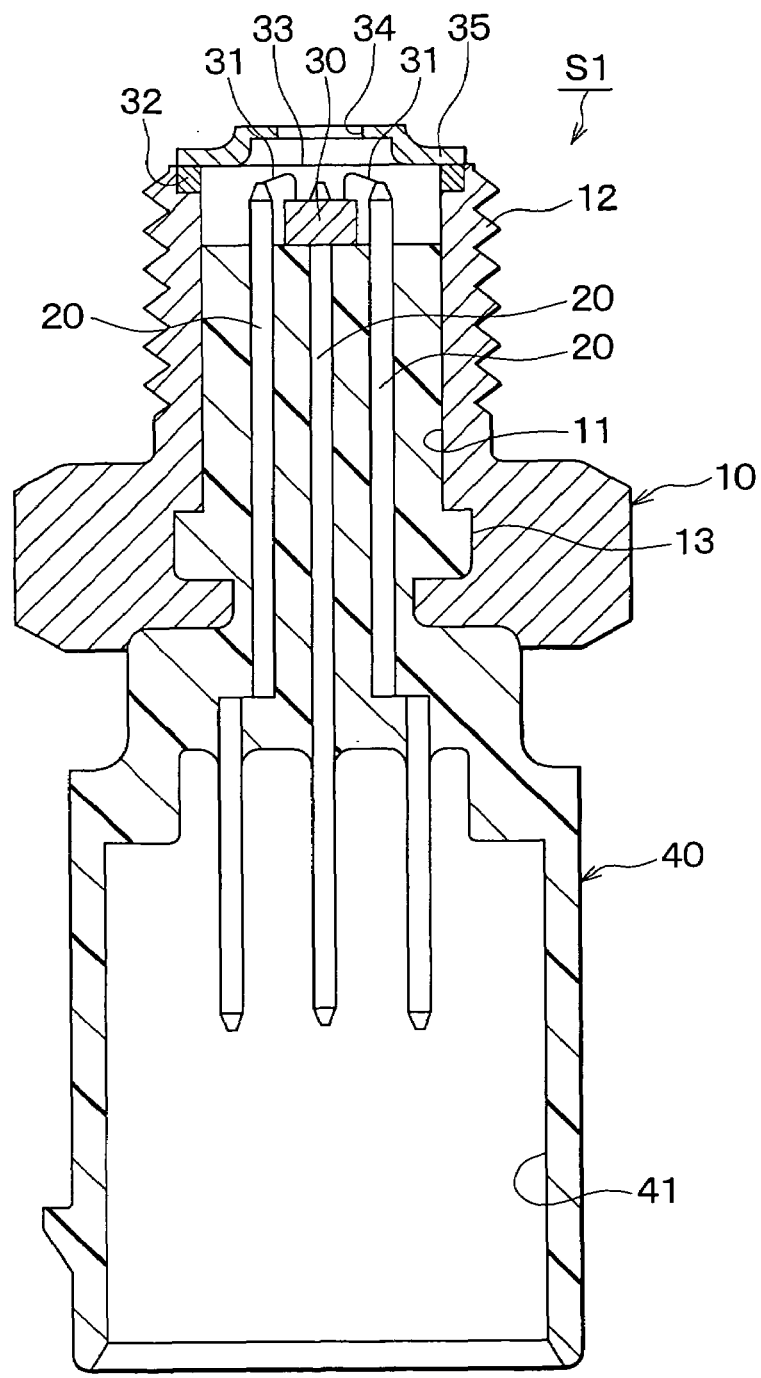
FIG. 1 is a schematic cross-sectional view showing a sensor according to a preferred embodiment of the present invention.

On the other hand, a sensor S1 according to a preferred embodiment of the present invention is prepared, as shown in FIG. 1. The sensor S1 senses a physical quantity such as temperature, magnetic field, acceleration and angular velocity. In this embodiment, the sensor S1 senses pressure of a measurement object such as oil, water, and air.

The sensor S1 includes a metallic housing 10 having a hollow portion 11, a terminal pin 20, a sensing element 30 connected to the terminal pin 20 electrically, and a resin casing 40. One end of the terminal pin 20 is inserted into the hollow portion 11. The casing 40 is disposed on an outer circumference of the terminal pin 20 and disposed on the other end of the terminal pin 20, which is opposite to the sensing element 30. The terminal pin 20 and the casing 40 provide a connector for connecting to an outer circuit (not shown) outside the sensor S1.

The housing 10 is made of stainless steel such as SUS-430 and formed by a cold casting method. The hollow portion 11 of the housing 10 has a cylindrical shape. However, the hollow portion 11 can be a prismatic shape and the like. A screw portion 12 is disposed on an outer circumferential sidewall of the housing 10, for mounting the sensor S1 to an outer attachment (not shown) outside the sensor.

The terminal pin 20 is made of metal such as C-2600, i.e., copper, and has a rod shape. The resin casing 40 is made of resin such as poly phenylene sulfide (i.e., PPS). The casing 40 seals a middle portion of the terminal pin 20 so that both ends of the terminal pin 20 protrude from the casing 40, respectively. A portion of the casing 40 disposed on the sensing element 30 side is accommodated in the hollow portion 11 of the housing 10, and occupies a space of the hollow portion 11. Thus, the casing 40 is integrated with the housing 10 and the terminal pin 20.

Figure 2:
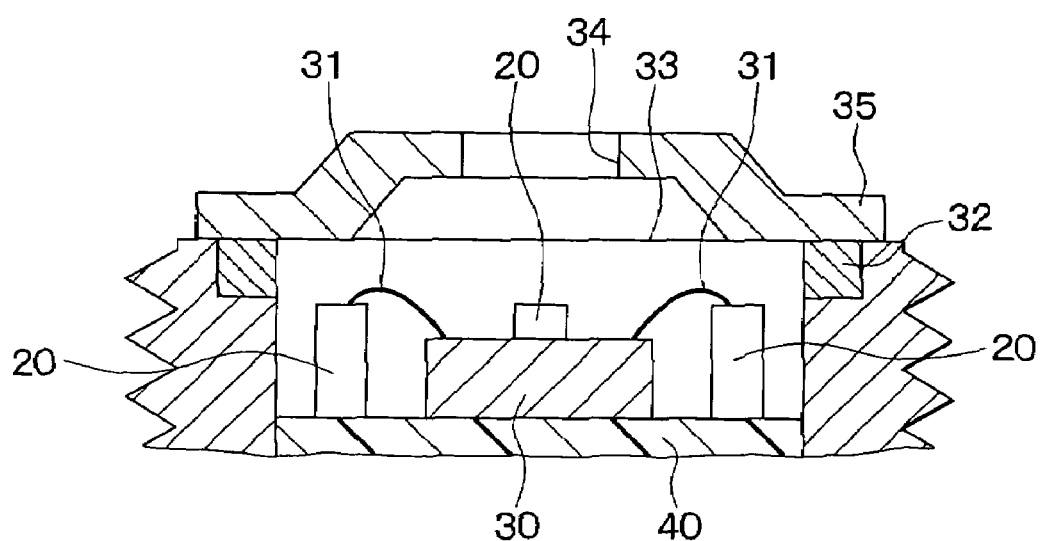
FIG. 2 is a partially enlarged cross-sectional view showing a sensing element of the sensor according to the preferred embodiment.

The sensing element 30 electrically connects to one end of the terminal pin 20 that protrudes from the casing 40 in the hollow portion 11. As shown in FIG. 2, the sensing element 30 is bonded and mounted on an upper surface of the casing 40 in the hollow portion 11. The sensing element 30 is composed of, for example, a semiconductor diaphragm type pressure sensor chip. When pressure is applied to a semiconductor diaphragm of the sensor chip, the diaphragm is distorted with the pressure, so that a strain gauge mounted on the diaphragm outputs a signal corresponding to a distortion.

The sensing element 30 and the one end of the terminal pin 20 are electrically connected with a bonding wire 31 such as a gold wire, an aluminum wire and the like. The sensing element 30 is covered with the metallic diaphragm 33, which is fixed to the housing 10 through a metallic seal 32. The metallic diaphragm 33 separates the sensing element 33 and the outer environment outside the sensor S1. Space surrounded and sealed by the metallic diaphragm 33, the housing 10, and the casing 40 is filled with oil as a sealing material and as a pressure conduction material. The oil is composed of, for example, fluoro-oil and the like. The metallic diaphragm 33 is covered with a cover 35 having a measurement port 34.

The sensor S1 senses the pressure of the measurement object as follows. The measurement object such as the air is introduced into the sensor S1 through the measurement port 34, so that the pressure of the measurement object is applied to the metallic diaphragm 33. Then, the metallic diaphragm 33 conducts the pressure to the semiconductor diaphragm of the sensing element 30 through the oil so that the pressure is applied to the semiconductor diaphragm of the sensing element 30. The sensing element 30 outputs a signal corresponding to the pressure.

As shown in FIG. 1, the other end of the terminal pin 20 also protrudes from the resin casing 40. An opening portion of the resin casing 40 is disposed around the other end of the terminal pin 20. Thus, the other end of the terminal pin 20 and the opening portion 41 provide a connector. Therefore, an outer connector (not shown) outside the sensor S1 is inserted into the opening portion 41 so that the other end of the terminal pin 20 and the outer connector are electrically connected. Then, the signal from the sensing element 30 is outputted to the outer circuit through the bonding wire, the terminal pin 20, and the outer connector.

Here, a part of the resin casing 40 occupies the space of the hollow portion 11, so that the casing 40 is integrated with the housing 10 and the terminal pin 20. The resin casing 40 is formed by insert molding method, which is performed by inserting a part of the terminal pin 20 into the hollow portion 11 of the housing 10. Preferably, an inner wall of the hollow portion 11 of the housing 10 has a groove 13 as an uneven portion for increasing the adhesiveness between the resin casing 40 and the housing 10, as shown in FIG. 1. The groove 13 is disposed on a part of the inner circumferential wall of the hollow portion 11 or on the entire inner circumferential wall of the hollow portion 11. The groove 13 is formed in such a manner that the inner circumferential wall of the hollow portion 11 is grooved after the housing 10 is formed by cold casting method.

The sensor S1 is formed as follows. A part of manufacturing process for manufacturing the sensor S1, i.e., insert molding process, is shown in FIGS. 3A-3C.

At first, as shown in FIGS. 3A and 3B, the housing 10 and the terminal pin 20 are prepared. The groove 13 is formed in the hollow portion 11 of the housing 10. A part of the terminal pin 20 is inserted into the hollow portion 11. Then, these housing 10 and the terminal pin 20 are set in a die (not shown). Next, as shown in FIG. 3C, resin material composing the resin casing 40 is cast into the die. The resin material is hardened, so that the resin casing 40 is formed with integrating with the housing 10 and the terminal pin 20.

Then, the sensing element 30 is fixed on the resin casing 40 by bonding, as shown in FIG. 2. The sensing element 30 and the terminal pin 20 are connected with the bonding wire 31. Then, the oil is poured, and the metallic diaphragm 33 and the cover 35 are mounted on the housing 10. Thus, the sensor S1 is accomplished.

Here, the resin casing 40 is formed by the insert molding method in such a manner that a part of the terminal pin 20 is inserted into the hollow portion 11 of the housing 10. Thus, the resin casing 40 is integrated with the housing 10 and the terminal pin 20, so that a part of the resin casing 40 occupies the space of the hollow portion 11. Since the housing 10, the terminal pin 20, and the resin casing 40 are integrated each other, no crimp joint for fixing the housing 10 to the casing 40 is necessitated.

Moreover, by the insert molding method, a bonding area between the resin casing 40 and the metallic housing 10 becomes larger. For example, in this embodiment, the entire inner circumferential wall of the hollow portion 11 of the housing 10 can be used as the bonding area. Therefore, the bonding strength between the resin casing 40 and the housing 10 becomes larger.

Thus, the sensor S1 having the metallic housing 10 and the resin casing 40 with the terminal pin 20, i.e., the connector, has a strong bonding between the housing 10 and the connector without a crimp joint. Further, the inner circumferential wall of the hollow portion 11 of the housing 10 has the groove 13 for increasing an adhesive force between the resin casing 40 and the housing 10. The housing 10 and the resin casing 40 are engaged by using the groove 13 as an uneven portion, so that the bonding area between the housing 10 and the resin casing 40 becomes much larger. Thus, the bonding strength is secured to become large.

(Other Embodiments)

Figure 4A:
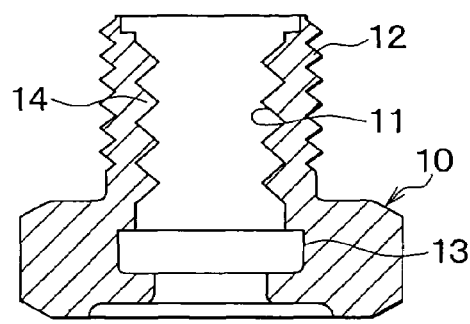
FIGS. 4A-4C are cross-sectional views of a housing of the sensor explaining modifications of the preferred embodiment.

The uneven portion for increasing the bonding strength can be modified as follows. As shown in FIG. 4A, the uneven portion 14 has a screw shape. In this case, a ridge and a root of the screw form the uneven portion 14. The uneven portion 14 is easily formed by a screw-cutting method with an ordinary screw-cutting device after the housing 10 is formed by the cold casting method.

Figure 4B:
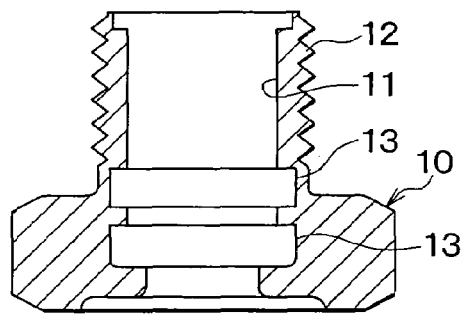

As shown in FIG. 4B, the groove 13 is used as the uneven portion. In this case, a plurality of grooves 13, for example, two grooves are formed in the hollow portion 11. By providing a plurality of grooves 13, an engagement between the resin casing 40 and the housing 10 increases so that the bonding strength is improved.

Figure 4C:
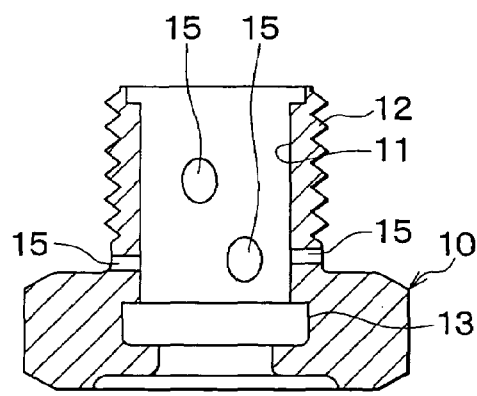

As shown in FIG. 4C, a through hole 15 is used as the uneven portion. The through hole 15 penetrates a sidewall of the hollow portion 11. In this case, the through hole 15 has a step as the uneven portion. The through hole 15 is formed by a drilling method after the housing 10 is formed by the cold casting method.

Moreover, the inner circumferential wall of the hollow portion 11 can be formed into a grain shape as the uneven portion. In other words, the inner circumferential wall of the hollow portion 11 of the housing 10 has a wrinkle as the grain. In this case, the wrinkle is used as the uneven portion. This wrinkle is formed by sand blasting the surface of the inner circumferential wall of the hollow portion 11 after the housing 10 is formed by the cold casting method.

Besides, the uneven portion 14 having the screw shape, a plurality of grooves 13, and the uneven portion having the wrinkle can be formed on a part of the inner circumferential wall of the hollow portion 11 or on the entire inner circumferential wall of the hollow portion 11.

When the hollow portion 11 of the hosing 10 has a cylindrical shape, the resin casing 40 may rotate around a center axis of the hollow portion 11 in relation to the housing 10. However, when the hollow portion has the through hole 15 as the uneven portion, the resin material composing the resin casing 40 is cast into the through hole 15 in the insert molding process so that the resin casing 40 is hooked to the through hole 15. Therefore, the resin casing 40 is prevented from rotating.

However, in a case where the inner circumferential wall of the hollow portion 11 of the housing 10 has no uneven portion, the housing 40 may rotate. Further, in a case where the uneven portion has rotation symmetry even though the hollow portion 11 has the groove 13 as the uneven portion, the uneven portion 14 having the screw shape, or the uneven portion having the wrinkle, the housing 40 may rotate.

Figure 5A:
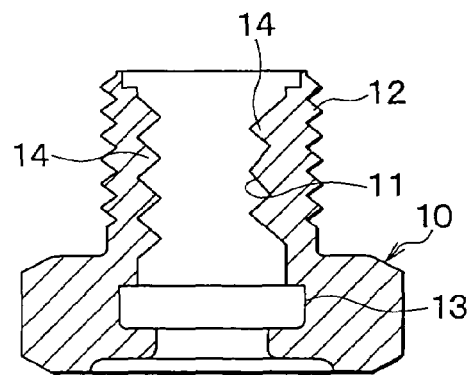
FIGS. 5A and 5B are cross-sectional views of the housing of the sensor explaining other modifications of the preferred embodiment.

To prevent the rotation of the housing 40, the hollow portion 14 is formed as follows. For example, as shown in FIG. 5A, the uneven portion 14 having the screw shape is formed asymmetrically in relation to the center axis of the hollow portion 11. Specifically, when the uneven portion 14 is formed on the entire inner circumferential wall of the hollow portion 11, a pattern of the screw, a screw length, and/or a screw pitch are changed partially. For example, they are changed at every 180° of the inner circumference. Moreover, the uneven portion can be formed partially. Thus, the housing 40 is prevented from rotating.

Similarly, the uneven portion having the wrinkle is also formed asymmetrically in relation to the center axis of the hollow portion 11, so that the housing 40 can be prevented from rotating around the center axis of the hollow portion 11.

Figure 5B:
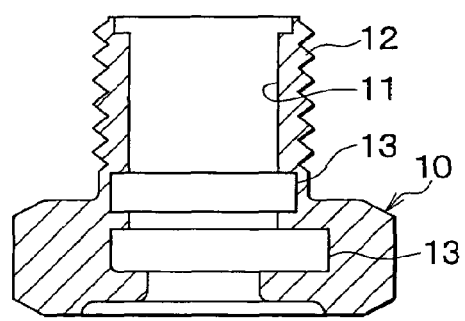

Further, as shown in FIG. 5B, when the uneven portion is the groove 13, a length of the groove is formed asymmetrically in relation to the center axis of the hollow portion 11 so that the housing 40 can be prevented from rotating. In FIG. 5B, two grooves 13 are formed on the entire inner circumferential wall of the hollow portion 11. In this case, a lower groove 13 is formed eccentrically in relation to the center axis of the hollow portion 11. Moreover, the groove 13 can be formed on a part of the inner circumferential wall of the hollow portion 11. In this case, the length of the groove 13 is formed eccentrically in relation to the center axis.

When the uneven portion is the groove 13 and the length of the groove 13 is too long, the resin material composing the resin casing 40 may not be cast into the entire groove 13 in the insert molding process. In other words, the resin material may not fill the entire groove 13. To cast into the entire groove 13, the hollow portion 11 is formed as follows.

Figure 6:
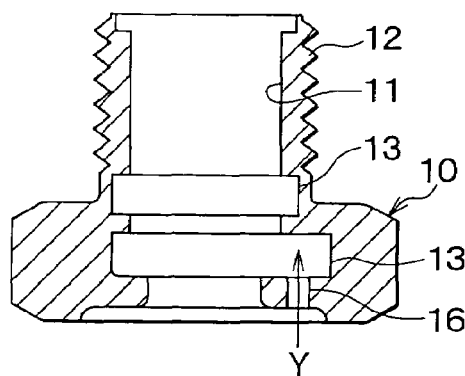
FIG. 6 is a cross-sectional view of the housing of the sensor explaining further modification of the preferred embodiment.

As shown in FIG. 6, a resin introduction port 16 is formed on the lower sidewall of the groove 13. The resin introduction port 16 penetrates the sidewall of the groove 13. In the insert molding process, the resin material composing the resin casing 40 is cast into the groove 13 through the resin introduction port 16, as shown arrow Y in FIG. 6. Therefore, the resin material can be cast into the entire groove 13 so that the groove 13 is filled with the resin material.

The terminal pin 20 is molded with the resin casing 40 by the insert molding method. When the terminal pin 20 is pulled in an axial direction of the terminal pin 20, e.g., the connector is pulled from the outer connector outside the sensor S1, the terminal pin 20 may be removed from the resin casing 40. To prevent the terminal pin from being removed from the casing 40, the terminal pin 20 preferably includes a hook portion. The hook portion is disposed in a portion of the terminal pin 20, which is molded with the resin casing 40. The hook portion of the terminal pin 20 hooks the resin casing 40 so that the hook portion prevents the terminal pin 20 from being displaced in the axial direction of the terminal pin 20. Thus, the terminal pin 20 is prevented from being removed.

Figure 7A:
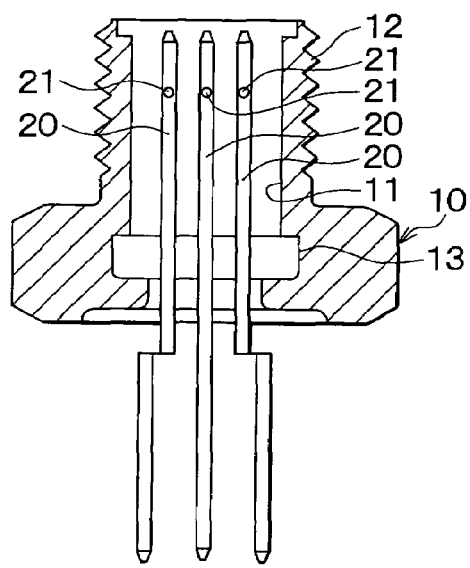
FIGS. 7A-7D are cross-sectional views of the housing of the sensor explaining further modifications of the preferred embodiment.

Some examples of the hook portion of the terminal pin 20 are shown in FIGS. 7A-7D. As shown in FIG. 7A, the hook portion is provided by a hole 21, which penetrates the terminal pin 20. The resin material composing the resin casing 40 is cast into the hole 21 in the insert molding process so that the hook portion is formed. Thus, the terminal pin 20 is prevented from being removed.

Figure 7B:
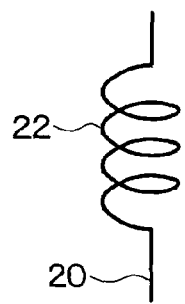
Figure 7C:
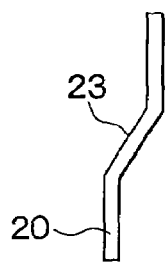

As shown in FIGS. 7B and 7C, the hook portions 22, 23 have non-linear shapes, which deviates from the axial direction of the terminal pin 20. For example, the hook portion 22 has a spiral shape, and the hook portion 23 has a crimp shape.

Figure 7D:
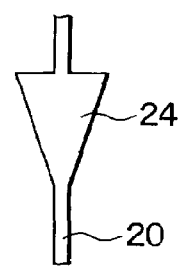

As shown in FIG. 7D, the hook portion 24 has a reverse taper shape, which expands toward the other end of the terminal pin 20. In other words, the terminal pin 20 has a portion, i.e., the hook portion 24, which has a reverse taper shape so as to prevent the terminal pin 20 from being removed.

Moreover, the surface of the terminal pin 20 is roughed by the sand blasting method and the like so that the hook portion is formed.

Although a part of the terminal pin 20 is disposed in the hollow portion 11, this part of the terminal pin 20 can be protruded from the upper end of the hollow portion 11. In this case, the sensing element 30 can be disposed outside the hollow portion 11. Moreover, the sensing element 30 can be disposed on a predetermined portion of the resin casing 40, and the sensing element 30 connects to the terminal pin 20 electrically. Here, the predetermined portion of the resin casing 40 is other than the upper surface of the casing 40 shown in FIG. 1.

Furthermore, as long as a sensor has a metallic housing and a resin connector with a terminal pin and the housing and the connector are integrated together, the sensor can be formed to have a large bonding strength without a crimp joint. For example, an acceleration sensor, a gas detector, an infrared detector, an optical sensor, and a flow-rate sensor can be used as the sensor S1. Furthermore, although the sensor S1 has a shape shown in FIG. 1, the sensor S1 can be formed to have another shape, which is different from the above shape shown in FIG. 1.

Such changes and modifications are to be understood as being within the scope of the present invention as defined by the appended claims.

What is claimed is:

1. A sensor comprising:
a metallic housing having a hollow portion;
a metallic terminal pin, a part of which is inserted into the hollow portion of the housing;
a pressure sensing element connected to one end of the terminal pin and disposed in the hollow portion; and
a resin casing;
wherein another end of the terminal pin and the resin casing provide a connector for connecting an outer circuit outside the sensor,
wherein a part of the resin casing is disposed in the hollow portion,
wherein the terminal pin and the housing are molded with the resin casing by insert molding so that the resin casing, the terminal pin, and the housing are integrated together,
wherein the one end and the another end of the terminal pin protrude from the resin casing,
wherein the hollow portion of the housing includes an inner wall having an uneven portion for increasing bonding strength between the resin casing and the housing, and
wherein the hollow portion of the housing further includes a through hole penetrating the inner wall of the hollow portion.

2. The sensor according to claim 1,
wherein the uneven portion has a screw shape.

3. The sensor according to claim 2,
wherein the hollow portion of the housing has a cylindrical shape with a center axis, and
wherein the screw shape of the uneven portion is asymmetric in relation to the center axis of the hollow portion.

4. The sensor according to claim 1, wherein the uneven portion has a wrinkle shape.

5. The sensor according to claim 4,
wherein the hollow portion of the housing has a cylindrical shape with a center axis, and
wherein the wrinkle shape of the uneven portion is asymmetric in relation to the center axis of the hollow portion.

6. The sensor according to claim 1,
wherein the uneven portion is a groove disposed on an inner wall of the hollow portion.

7. The sensor according to claim 6,
wherein the hollow portion of the housing has a cylindrical shape with a center axis, and
wherein the groove is asymmetric in relation to the center axis of the hollow portion.

8. The sensor according to claim 6,
wherein the groove has a, resin introduction port for introducing resin material in a case where the terminal pin and the housing are molded with the resin casing by insert molding.

9. The sensor according to claim 1,
wherein the uneven portion includes a through hole penetrating the inner wall of the hollow portion.

10. The sensor according to claim 1,
wherein the terminal pin has a book portion for hooking the terminal pin to the resin casing so that the terminal pin is prevented from being removed from the resin casing in an axial direction of the terminal pin, the hook portion being molded with the resin casing.

11. The sensor according to claim 10,
wherein the hook portion of the terminal pin is a hole penetrating the terminal pin.

12. The sensor according to claim 10,
wherein the hook portion of the terminal pin is provided by the terminal pin having a non-linear shape, which deviates from a center axis of the terminal pin.

13. The sensor according to claim 10,
wherein the hook portion of the terminal pin is provided by the terminal pin having a taper shape, which expands toward one end of the terminal pin.

14. The sensor according to claim 10,
wherein the hook portion of the terminal pin is provided by the terminal pin having a rough surface.

15. A sensor comprising:
a metallic housing having a hollow portion;
a metallic terminal pin for connecting an outer circuit outside the sensor;
a pressure sensing element connected to one end of the terminal pin, for sensing physical quantity, and disposed in the hollow portion; and
a resin casing,
wherein the terminal pin is accommodated in the resin casing except for a portion, which connects to the outer circuit,
wherein the resin casing is inserted in the hollow portion of the housing so that the housing and the resin casing are integrated with each other,
wherein the one end and the portion of the terminal, pin protrude from the resin casing,
wherein the hollow portion of the housing includes an inner wall having an uneven portion for increasing bonding strength between the resin casing and the housing, and
wherein the hollow portion of the housing further includes a through hole penetrating the inner wall of the hollow portion.

16. The sensor according to claim 15,
wherein the terminal pin and the housing are molded with the resin casing by insert molding.

17. The sensor according to claim 15,
wherein the terminal pin includes a hook portion for hooking the terminal pin to the resin casing so that the terminal pin is prevented from being removed from the resin casing, the hook portion being molded with the resin casing.

18. The sensor according to claim 17,
wherein the hollow portion of the housing has a cylindrical shape with a center axis, and
wherein the uneven portion of the hollow portion is asymmetric in relation to the center axis of the hollow portion.

* * * * *